United States Patent [19]

Ray

[11] 4,254,347

[45] Mar. 3, 1981

[54] POWER-ON RESET CIRCUIT FOR MONOLITHIC I.C.'S

[75] Inventor: Kenneth I. Ray, Mesa, Ariz.

[73] Assignee: Motorola, Inc., Schaumburg, Ill.

[21] Appl. No.: 956,759

[22] Filed: Nov. 1, 1978

[51] Int. Cl.³ ............................................. H03L 1/00
[52] U.S. Cl. .................................... 307/297; 307/237
[58] Field of Search ....................... 307/237, 296, 297

[56] References Cited

U.S. PATENT DOCUMENTS

| | | | |
|---|---|---|---|
| 3,253,210 | 5/1966 | Cummins | 307/297 X |
| 3,317,818 | 5/1967 | Beyer | 307/297 X |
| 3,523,198 | 8/1970 | Keller | 307/297 |
| 3,754,182 | 8/1973 | Morris et al. | 307/297 X |

*Primary Examiner*—John S. Heyman
*Attorney, Agent, or Firm*—Maurice J. Jones, Jr.

[57] ABSTRACT

A circuit for providing a control signal having a first predetermined magnitude in response to an analog voltage having a magnitude below a particular threshold and the control signal having a second predetermined magnitude in response to the magnitude of the analog voltage being above the particular threshold includes a threshold establishing circuit, a first transistor and a second transistor. The threshold establishing circuit receives the analog voltage and enables the first transistor to remain non-conductive until the analog voltage reaches the threshold. The second transistor is connected to the first transistor and to the analog voltage supply. The second transistor is arranged to be initially conductive as the magnitude of the analog voltage rises, and to become non-conductive in response to the first transistor being rendered conductive so that the desired control signal is developed at an output electrode of the second transistor.

3 Claims, 3 Drawing Figures

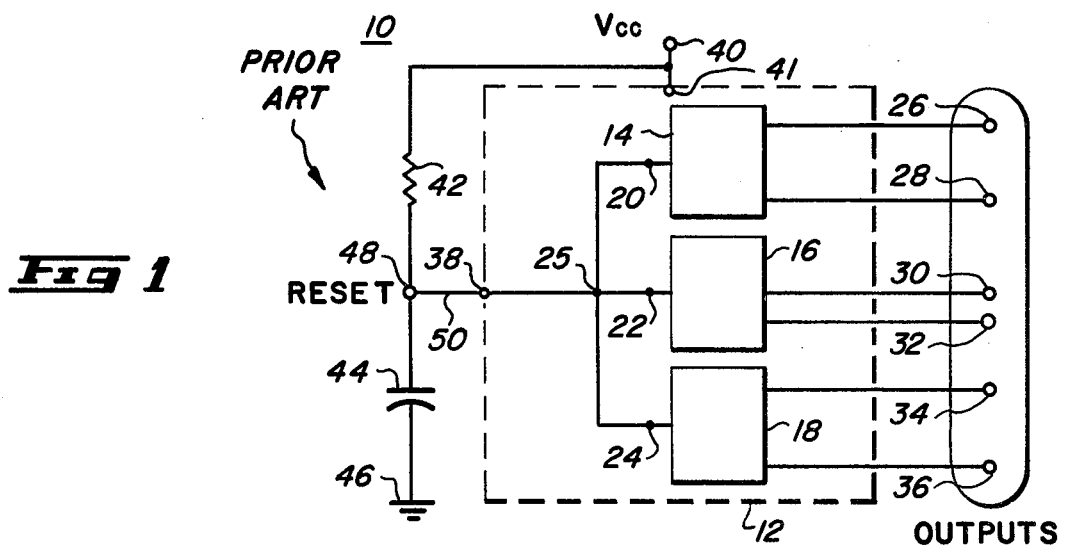
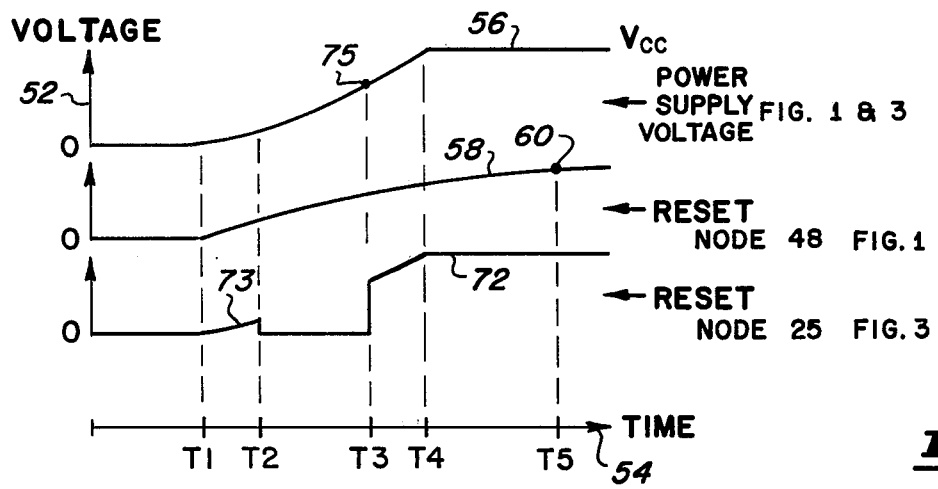
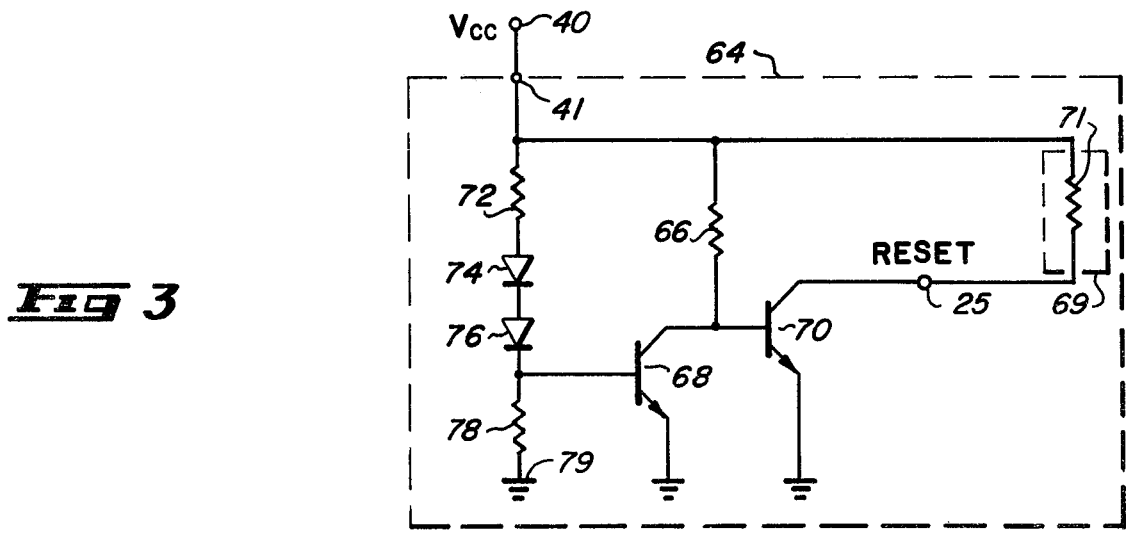

POWER-ON RESET CIRCUIT FOR MONOLITHIC I.C.'S

BACKGROUND OF THE INVENTION

Modern electronic products, such as those including microprocessors, often include digital systems and subsystems having binary output terminals which must be set to predetermined logic levels in response to the initial application of electrical power. This setting of the output levels is required before such systems and subsystems can begin operation. For instance, a dynamic RAM controller circuit includes a pair of interconnected flip-flops which have output terminals that must be set or reset to predetermined binary levels in response to the initial application of the power supply voltage. Also, multiplexers sometimes include counters having output terminals that must be set or forced to particular binary levels in response to the initiation of the power supply voltage. There are many other kinds of circuits which also require that output terminals thereof be set or forced to predetermined states in response to initial energization by a power supply. Oftentimes these circuits are provided in monolithic integrated circuit form.

In the past, the output levels of such systems and sub-systems were forced to desired known predetermined states by internal reset circuitry driven by signals derived from external sources. In the case of an integrated circuit system and subsystem, an external pin-out is required for coupling the internal reset circuitry to the external circuits, which generally provide a reset control potential of relatively low magnitude for a selected time in response to initial energization by the power supply. The internal reset circuitry responds to the reset control potential to cause the output signal states to assume the desired predetermined levels. The prior art circuits for providing the reset control voltage for the reset circuitry often include a reset switch or a discrete series circuit having a resistor connected in series with a capacitor, which provides a reset control voltage having a resistance-capacitance (RC) time constant at an output terminal therebetween. The reset circuitry is coupled to the output terminal.

The foregoing prior art solutions are particularly disadvantageous when applied to integrated circuits, which must be designed to fit into readily available packages which have a fixed number of pins associated therewith. To minimize the cost of the integrated circuit device, it is desirable to use packages with as few pins as possible. Thus, it is undesirable to require a pin for only the reset function. For example, such a requirement can make the difference between being able to utilize a standard 24 pin package instead of a standard 28 pin package. Use of the larger package not only costs more but takes up more space which can be particularly detrimental if a multiplicity of such packages are required, as may be the case with present computer boards. Moreover, the use of external switches, capacitors and resistors also increases costs, takes up space and complicates mechanical layout of the product. In addition, the manually resettable switch or RC time constant implementations for providing the reset signal sometimes cause an undesirable amount of time delay between the point in time when the product is initially energized and the point in time when the internal signal states have been set to the proper levels so that the product can begin operating. Furthermore, such implementations cannot be fabricated as part of an integrated circuit structure.

SUMMARY OF THE INVENTION

Thus, it is an object of the invention to provide a power-on reset circuit which can be fabricated as part of the structure of a monolithic integrated circuit thereby eliminating the requirement for external components and reducing the requirements for external pin-outs.

Another object of the invention is to provide a reset circuit which quickly responds to the application of the power supply voltage so that undesirable time delay does not occur before circuits coupled thereto are operable after energization.

Still another object of the invention is to provide a power-on reset circuit which is simple, inexpensive and reliable.

Briefly, a circuit of one embodiment provides a control signal having a first predetermined magnitude in response to an analog input voltage having a magnitude below a particular threshold and the control signal has a second predetermined magnitude in response to the magnitude of the analog voltage being above the particular threshold. The magnitude of the analog voltage generally increases with time. The circuit includes a threshold establishing circuit which is connected between the analog voltage supply and a first electron control device. The threshold establishing circuit renders the first electron control device non-conductive in response to the magnitude of the analog voltage being below the particular threshold. Moreover, the threshold establishing circuit renders the first electron control device conductive in response to the analog voltage having a magnitude above the particular threshold. A control electrode of a second electron control device is connected to an output electrode of the first electron control device. The second electron control device is rendered conductive in response to the first electron control device being rendered non-conductive and non-conductive in response to the first electron control device being rendered conductive. Thus, the second electron control device is initially rendered conductive in response to the analog voltage having a magnitude below the particular threshold to provide the control signal of the first predetermined magnitude and the second electron control device is rendered non-conductive to provide the control signal of the second predetermined magnitude in response to the magnitude of the analog voltage rising above the particular threshold.

BRIEF DESCRIPTION OF THE DRAWINGS

FIG. 1 is a partial block and schematic diagram illustrating a prior art RC technique for providing a reset signal;

FIG. 2 shows graphs of voltage with respect to time which are useful in understanding the operation of the circuits of FIG. 1 and FIG. 3; and FIG. 3 is a schematic diagram of a power-on reset circuit in accordance with the present invention.

DETAILED DESCRIPTION OF THE PREFERRED EMBODIMENT

FIG. 1 is a partial block and schematic diagram of a prior art power-on reset system 10. Dashed box 12 includes logic blocks 14, 16 and 18 which have respective reset terminals 20, 22 and 24, which are internally connected to reset node 25, and respective pairs of output terminals 26, 28; 30, 32; and 34, 36. Reset node 25 is connected to an internal portion of reset pin 38. Power supply terminal 40 is connected to an external portion of pin 41 of integrated circuit 12 and through the discrete external series RC circuit including resistor 42 and capacitor 44 to ground or reference conductor 46. Circuit node 48, between resistor 42 and capacitor 44, is connected through conductor 50 to an external portion of pin 38 of integrated circuit 12.

FIG. 2 is a graph of voltage magnitudes, which are plotted along ordinate axes 52, versus time, which is plotted along abscissa axis 54. Line 56 of FIG. 2 represents the dynamic magnitude of the power supply voltage ($V_{CC}$) with respect to time. More specifically, until time $T_1$, the power supply voltage is shown to have a zero magnitude. Between times $T_1$ and $T_4$, the magnitude of the power supply voltage ramps or exponentially increases to its regulated, relatively constant level. The magnitude of the power supply voltage cannot instantaneously change from zero to its regulated level because of internal capacitance and other characteristics inherent in the power supply. Between times $T_1$ and $T_4$, the power supply voltage is defined as being an analog voltage.

Graph 58 of FIG. 2 shows that the magnitude of the reset control voltage at terminal 48 of FIG. 1 changes in response to the magnitude of power supply voltage 56. More specifically, the magnitude of the reset voltage at node 48 begins to rise at time $T_1$ but remains low and thereby resets the logic blocks 14, 16 and 18 until time $T_5$. At time $T_5$, the magnitude of the reset voltage reaches a predetermined level indicated by point 60 which releases logic blocks 14, 16 and 18 and allows them to begin operation. Level 60 is not reached until the magnitude of the power supply voltage 56 has stabilized to prevent logic blocks 14, 16 and 18 from generating false outputs. After time $T_5$, the magnitude of the voltage on reset node 48 continues to increase toward the magnitude of the power supply voltage but this has no effect on the operation of the logic blocks.

The main disadvantages of the reset scheme shown in FIG. 1 have already been mentioned in the "Background of the Invention" but will now be more specifically described. Reset scheme 10 of FIG. 1 requires that an external pin 38 be provided for integrated circuit 12. This tends to require that integrated circuit 12 be placed in a larger package which takes up more space and costs more than otherwise would be the case. Reset scheme 10 of FIG. 1 also requires the use of external components 42 and 44 which further increases costs and takes up space. In addition, the scheme of FIG. 1 may undesirably delay the time, $T_5$, when logic blocks 14, 16 and 18 are allowed to begin operation with respect to the power supply turn-on time, $T_1$.

Circuitry enclosed in dashed block 64 of FIG. 3 of one embodiment of the invention solves the foregoing problems. The positive power supply conductor or terminal 40, pin 41 and terminal 25 are labeled with the same reference numbers as used in FIG. 1 to show the correspondence therebetween. Block 69 including resistance 71 represents the load provided by logic blocks 14, 16 and 18, for instance. Positive power supply terminal 40 is connected through resistor 66 to the collector of NPN transistor 68 and to the base of NPN transistor 70. Furthermore, positive power supply terminal 40 is connected through another series path including resistor 72 and diodes 74 and 76 to the base or control electrode of transistor 68. Resistor 78 is connected between the base electrode of transistor 68 and negative power supply conductor 79. The emitter electrodes of transistors 68 and 70 are also connected to negative supply conductor 79 and the collector electrode of transistor 70 is connected to terminal 25, which is electrically coupled through load 69 to power supply conductor 40. The base electrodes of transistors 68 and 70 are defined as control electrodes and the emitter and collector electrodes thereof are defined as main electrodes.

Line 72 of FIG. 2 illustrates the characteristics of the reset or control signal generated at terminal 25 with respect to the magnitude of the power supply voltage 56. Beginning at time $T_1$, as the magnitude of the power supply voltage begins to increase, the voltage on terminal 40 of FIG. 3 likewise increases. As shown by portion 73 of line 72 between times $T_1$ and $T_2$, the voltage at reset terminal 25 tends to increase because transistor 70 provides some finite impedance at the collector electrode thereof, and load resistance 71 applies the power supply voltage to the collector of transistor 70. Portion 73 forms part of the reset signal because it does not rise to a sufficient level to enable release of the load circuits connected to terminal 25. When the power supply voltage exceeds the base-to-emitter turn-on voltage of transistor 70 at time, $T_2$, transistor 70 goes into a saturated state and then the collector voltage of transistor 70 drops to a low level so that the desired reset signal is continuously applied to blocks 14, 16 and 18, for instance. As further illustrated by graph 72 of FIG. 2, the reset signal exists until time $T_3$. Transistor 68 remains non-conductive while transistor 70 is saturated before time $T_3$ because the power supply voltage does not reach a sufficient magnitude to forward bias threshold determining diodes 74 and 76 and transistor 68 until time $T_3$. Accordingly, transistor 68 does not receive sufficient drive to be conductive until time $T_3$.

At time $T_3$, the magnitude of the power supply voltage has risen to a sufficient level, as indicated by point 75 of FIG. 2, to forward bias diodes 74 and 76 and render transistor 68 conductive. When transistor 68 becomes conductive, the base drive current for transistor 70 is shunted through the collector-to-emitter path of transistor 68 to negative supply conductor 79. As a result, transistor 70 becomes non-conductive and its collector voltage rises at time $T_3$ to a logical "1", which removes the reset signal from logic blocks 14, 16 and 18 and allows them to operate. The difference between times $T_1$ and $T_3$ can be adjusted by adjusting the threshold level. This is accomplished by increasing or decreasing the number of diodes connected in series with resistor 72. The threshold level of circuit 64 is determined by resistor 72, diode 74, diode 76, resistor 78 and the emitter-to-base voltage characteristic of transistor 68 as defined by the following equation:

$$V_{be68}(3+R_{72}/R_{78})$$

where
$V_{be68}$ = the base-to-emitter voltage of transistor 68;
$R_{72}$ = the resistance of resistor 72; and
$R_{78}$ = the resistance of resistor 78.

Thus, the circuit configuration of FIG. 3 is tailorable to meet the needs of individual supplies and applications. Generally, two diodes are used with $T^2L$ logic systems which normally operate at a power supply magnitude of about 5 volts.

The function of resistor 78, which can have a resistance of 20 Kilohms, is to maintain transistor 68 off during the initial rise of the power supply voltage by conducting any leakage current across the collector-to-base junction of transistor 68. Resistor 72, which can have a resistance of 10 Kilohms, cooperates with resistor 78 to limit the magnitude of the base current applied to transistor 68. Resistor 66, which can have a resistance of 20 Kilohms, limits the magnitude of the base current supplied to transistor 70.

When the power supply is turned off, the magnitude of $V_{CC}$ begins to exponentially decay. As the magnitude of the power supply voltage crosses the threshold, transistor 68 is again rendered non-conductive which enables transistor 70 to again saturate. Transistor 70 then creates the low value of reset signal at terminal 71 which renders logic blocks 14, 16 and 18 inoperative and sets their outputs to predetermined levels so that they do not create errors which might otherwise cause malfunction of other loads connected to the outputs thereof.

What has been described is a simple, reliable and inexpensive reset circuit 64. The most important advantage of circuit 64 is that it requires no additional external pin in order to perform the reset function because it utilizes the power supply pin, for instance 41, which must otherwise be provided to enable operation of the integrated circuit. Moreover, external components such as resistor 42 and capacitor 44 of FIG. 1 are not required for utilization with circuit 64. In addition, the configuration of circuit 64 enables precise selection of the point in time when the reset signal is terminated with respect to the magnitude of the power supply voltage to enable the immediate functioning of circuitry associated therewith such as logic blocks 14, 16 and 18.

I claim:

1. A reset circuit for providing a digital control signal having a first predetermined magnitude in response to an analog voltage having a magnitude below a second particular threshold and the digital control signal having a second predetermined magnitude in response to the magnitude of the analog voltage being above said second particular threshold, the circuit including in combination:

digital logic means having a control terminal for receiving the digital control signal;

analog voltage supply for providing an analog voltage having an increasing magnitude;

threshold establishing circuit means for providing said second particular threshold, said threshold establishing circuit means being connected to said analog voltage supply;

initially non-conductive first electron control means connected to said threshold establishing circuit means, said threshold establishing circuit means maintaining said first electron control means non-conductive in response to the magnitude of the analog voltage being below said second particular threshold and rendering said first electron control means conductive in response to the analog voltage having a magnitude above said second particular threshold;

initially non-conductive second electron control means having a control electrode and an output electrode, said control electrode being connected to said first electron control means and to said analog voltage supply, said output electrode being directly connected only to said control terminal of said digital logic means, said initially non-conductive second electron control means being rendered conductive in response to said analog supply voltage being above a first particular threshold while said first electron control means is maintained non-conductive by said threshold establishing circuit, said second electron control means further being rendered non-conductive in response to said first electron control means being rendered conductive when the magnitude of said analog supply voltage goes above said second particular threshold, said second electron control means thereby being initially rendered conductive in response to said analog voltage of increasing magnitude to provide the control signal of the first predetermined magnitude to reset said digital logic means so that said digital logic means is non-responsive to other signals, and said second electron control means thereby being rendered non-conductive to provide said control signal having the second predetermined magnitude in response to the increasing magnitude of said analog voltage rising above said second particular threshold to allow said digital logic means to become responsive to other signals.

2. The circuit of claim 1 wherein said threshold establishing circuit means includes at least one resistive means connected in series with at least one semiconductor diode means.

3. The circuit of claim 1 wherein:

said first electron control means includes a first transistor of a particular conductivity type having a control electrode and a pair of main electrodes, said control electrode of said first transistor being connected to said threshold establishing circuit means; and said second electron control means includes a further transistor of said particular conductivity type having a control electrode and a pair of main electrodes, said control electrode of said further transistor being connected to one of said main electrodes of said first transistor and one of said main electrodes of said further transistor being connected to said other main electrode of said first transistor, said other main electrode of said further transistor being connected to only said control terminal of said digital logic means.

* * * * *